US008946000B2

(12) United States Patent  
Reber et al.

(10) Patent No.: US 8,946,000 B2  
(45) Date of Patent: Feb. 3, 2015

(54) METHOD FOR FORMING AN INTEGRATED CIRCUIT HAVING A PROGRAMMABLE FUSE

(71) Applicant: Freescale Semiconductor, Inc., Austin, TX (US)

(72) Inventors: Douglas M. Reber, Austin, TX (US); Mehul D. Shroff, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/774,486

(22) Filed: Feb. 22, 2013

(65) Prior Publication Data

US 2014/0239440 A1 Aug. 28, 2014

(51) Int. Cl.
*H01L 21/82* (2006.01)
*H01L 21/768* (2006.01)
*H01L 23/525* (2006.01)

(52) U.S. Cl.
CPC ...... *H01L 21/76886* (2013.01); *H01L 23/5256* (2013.01)
USPC ............................ 438/131; 438/190; 257/529

(58) Field of Classification Search
USPC .......... 257/209, 734, 744, E23.149; 438/131, 438/190, 381
See application file for complete search history.

(56) References Cited

U.S. PATENT DOCUMENTS

| | | | |
|---|---|---|---|
| 3,619,725 A | 11/1971 | Mendham et al. | |
| 5,025,300 A | 6/1991 | Billig et al. | |
| 5,266,529 A | 11/1993 | Lau et al. | |
| 5,795,819 A | 8/1998 | Motsiff et al. | |
| 5,986,319 A | 11/1999 | Huggins | |
| 6,033,939 A | 3/2000 | Agarwala et al. | |
| 6,100,118 A | 8/2000 | Shih et al. | |
| 6,180,503 B1 | 1/2001 | Tzeng et al. | |
| 6,235,557 B1 | 5/2001 | Manley | |
| 6,559,042 B2 | 5/2003 | Barth et al. | |
| 6,667,533 B2 | 12/2003 | Daubenspeck et al. | |
| 6,677,226 B1* | 1/2004 | Bowen et al. | 438/601 |
| 6,713,381 B2 | 3/2004 | Barr et al. | |
| 6,730,982 B2 | 5/2004 | Barth et al. | |
| 6,737,345 B1 | 5/2004 | Lin et al. | |
| 7,148,089 B2 | 12/2006 | Hung et al. | |
| 7,535,078 B2 | 5/2009 | Kobayashi et al. | |
| 2003/0151116 A1* | 8/2003 | Cabral et al. | 257/532 |
| 2004/0219720 A1* | 11/2004 | Jeng et al. | 438/131 |
| 2007/0296054 A1* | 12/2007 | Kim | 257/529 |
| 2008/0217735 A1 | 9/2008 | Chen et al. | |
| 2010/0270641 A1* | 10/2010 | Manning | 257/529 |
| 2012/0049320 A1* | 3/2012 | Parsey et al. | 257/528 |

OTHER PUBLICATIONS

J. F. Lin et al., Classical and Quantum Transport in Focused-Ion-Beam-Deposited Pt nanointerconnects, American Institute of Physics, Applied Physics Letters, vol. 82, No. 5, Feb. 3, 2003.
C. Kothandaraman et al., Electrically Programmable Fuse (eFUSE) Using Electromigration in Silicides, IEEE Electron Device Letters, vol. 23, No. 9, Sep. 2002.

* cited by examiner

*Primary Examiner* — Phuc Dang
(74) *Attorney, Agent, or Firm* — Terrile, Cannatti, Chambers & Holland, LLP; Michael Rocco Cannatti

(57) ABSTRACT

A back-end-of-line thin ion beam deposited fuse (204) is deposited without etching to connect first and second last metal interconnect structures (110, 120) formed with last metal layers (LM) in a planar multi-layer interconnect stack to programmably connect separate first and second circuit connected to the first and second last metal interconnect structures.

19 Claims, 3 Drawing Sheets

METHOD FOR FORMING AN INTEGRATED CIRCUIT HAVING A PROGRAMMABLE FUSE

BACKGROUND OF THE INVENTION

1. Field of the Invention

The present invention is directed in general to field of semiconductor devices. In one aspect, the present invention relates to programmable fuse structures and associated programming operations.

2. Description of the Related Art

After forming circuitry on a semiconductor device, it is desirable to change the state or functional operation of some circuitry. One approach which allows for the dynamic real-time reprogramming circuitry is to include electrically programmable connection circuits or fuses for attaching different circuit components or areas together. When it is desired to change the connection state of the fuse connection structure, portions of the fuse are removed in order to create an opening or disconnect between the different circuit components or areas, such as by subjecting a portion of the fuse connection structure to energy from a laser. With some approaches, fuses are formed from thick metal lines which are deposited and then etched to define a fuse connection structure connecting two different circuit components or areas, where the fuse connection structure is surrounded by an interlayer dielectric (ILD) and/or covered by a passivation layer. As will be appreciated, the etch processing required to define the fuse connection structures can damage the underlying layers. In addition, fuse connection structures formed with thick metal fuses may be difficult to form on non-planar surfaces, and are difficult to laser program due to reflectivity, metal thickness, and damage to the surrounding ILD layer. In other approaches, fuses are formed by depositing and patterning one or more interconnect barrier layers over the last metal/interconnect features, but the fabrication of these fuses typically requires that a protective layer be formed over the last metal and bond pad layers to prevent metal corrosion (in the case of copper metal lines) during etching of the interconnect barrier layer(s). In addition, the overlap requirements for the interconnect barrier layer(s) to account for process variation can effectively increase the minimum pitch spacing between last metal features. In yet other approaches, fuses may be formed using the last metal layer to define the fuse connection structure, but the etch processes used to program or blow such coplanar last metal fuses typically require deposition of a uniform thin film followed by a patterned etch process that can cause metal corrosion.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
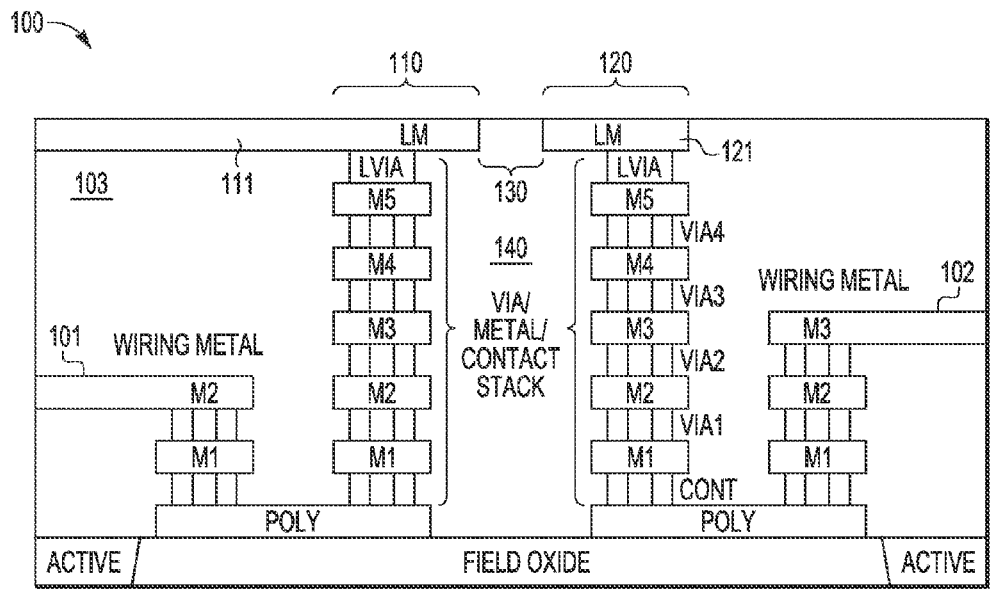
FIG. 1 illustrates in cross-sectional form a portion of an integrated circuit in which are formed separate multi-layer interconnect stacks connected, respectively, to separate circuit components or areas in accordance with selected embodiments of the disclosure.

A integrated circuit process and resulting integrated circuit are described for fabricating fuse connection structures to programmably connect separate circuit components or areas formed in the integrated circuit using a thin ion beam deposition process to selectively form the conductive fuse connection structures to connect last metal layers in an multilayer interconnect stack. In selected embodiments, the fuse connection structures are formed using focused ion beam (FIB) deposition techniques to form a thin fuse layer having a predetermined thickness (e.g. less than approximately 500 Angstroms) which are suitable for inclusion after the final polish step in a dual-damascene flow. By selecting the appropriate metal material for the FIB deposition process (e.g., Ta, Ti, TaN, TiN, etc.), the deposited metal layer may be readily oxidized or otherwise covered with an appropriate passivating layer, while also be suitably absorptive to a programming laser beam's spectrum. With this approach, selected embodiments may avoid the additional processing steps and associated disadvantages, minimum spacing constraints, and/or programming challenges associated with the formation of conventional fuses.

In this disclosure, an improved integrated circuit design, structure, and method of manufacture are described for forming thin ion beam deposited fuse structures as part of the back-end-of-line process to address various problems in the art where various limitations and disadvantages of conventional solutions and technologies will become apparent to one of skill in the art after reviewing the remainder of the present application with reference to the drawings and detailed description provided herein. While various details are set forth in the following description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an integrated circuit structure that are not necessarily drawn to scale and that do not include every device feature or geometry in order to avoid limiting or obscuring the present invention. Such descriptions and representations are used by those skilled in the art to describe and convey the substance of their work to others skilled in the art. In addition, although specific example materials, thicknesses, and processes are described herein, those skilled in the art will recognize that other materials, thicknesses, and processes with similar properties or characteristics can be substituted without loss of function. It is also noted that, throughout this detailed description, certain materials will be formed and removed to fabricate the integrated circuit structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention. Various illustrative embodiments of the present invention will now be described in detail with reference to the accompanying figures.

Turning now to FIG. 1, there is illustrated in cross-sectional form a portion of an integrated circuit structure 100 in which are formed separate multi-layer interconnect stacks 110, 120 connected, respectively, to separate circuit components or areas (not shown) via a second metal wiring metal (M2) 101 and a third metal wiring metal (M3) 102. Though the specific layout and structure of the integrated circuit structure 100 may vary from one embodiment to the next, the depicted integrated circuit structure 100 includes active semiconductor substrate regions (ACTIVE) separated by a field oxide or other insulation region (Field Oxide). The active substrate regions may be formed of any semiconductor material, such as silicon, silicon germanium, etc. Within the active substrate regions are formed one or more semiconductor devices (not shown), and overlying the substrate is a plurality of conductive interconnect and interlayer dielectric (ILD) layers defining the multi-layer interconnect stacks 110, 120. For example, a last interconnect or last metal (LM) layer is defined to form the last or topmost metal layers 111, 121 formed in one of the interlayer dielectric layers 103, each which overlies a last via (LVIA) layer which is formed in one of the interlayer dielectric layers 103. In turn, the last metal (LM) and last via (LVIA) layers are disposed over a next-to-last interconnect or metal line layer (M5) and next-to-last via layer (VIA4) which are formed in one or more of the interlayer dielectric layers 103. In similar fashion, successive metal line layers (M4, M3, M2, M1) and associated via or contact layers (VIA3, VIA2, VIA1, CONT) are formed in the interlayer dielectric layers 103 to make electrical contact with the poly conductor layers (POLY) which are disposed on the field oxide and connected via one or more metal/contact/via layers to other circuit components or areas (not shown) which may include transistors, resistors, inductors, capacitors, the like, and combinations of the above. For example, the first multi-layer interconnect stack 110 is connected to the second metal wiring metal (M2) 101 via patterned M1 layer (and associated vias) on the left, while the second multi-layer interconnect stack 120 is connected to the third metal wiring metal (M3) 102 via patterned M1 and M2 layers (and associated vias) on the right. Though the various metal and via layers are shown in FIG. 1 as being stacked in alignment on top of one another, it will be appreciated that the vias and interconnects are not required to be stacked in this way, but can be arranged in any desired way that provides the required electrical connection to the respective poly conductor layers.

The last or topmost metal layers 111, 121 in the integrated circuit structure can be formed with any conductive material, such as aluminum, copper, tantalum, tungsten, tantalum nitride, tungsten nitride, titanium, titanium nitride, or the like and combinations of the above, and is preferably copper formed over a tantalum nitride layer. As illustrated, each of the last metal layers 111, 121 is coupled to first and second separate circuit components or areas (not shown) via a second metal wiring metal (M2) 101 and a third metal wiring metal (M3) 102, but are separate from one another by a space 130 between the last metal layers so as to be electrically disconnected from one another. As illustrated, the gap 130 may be located over a multi-layer ILD stack 104 which serves to electrically isolate the multi-layer interconnect stacks 110, 120. In addition, each constituent layer in the ILD stack 103 may be formed with any insulating material, such as silicon dioxide formed using tetraethylorthosilane (TEOS), fluorinated silicon dioxide formed using F-TEOS, a low dielectric constant (low-k) material and can be formed using chemical vapor deposition (CVD), plasma-enhanced chemical vapor deposition (PECVD), physical vapor deposition (PVD), atomic layer deposition (ALD), or any combination(s) of the above to a predetermined final thickness. While the specific arrangement, construction, and connection of the different conductive interconnect layers is not important, each may be constructed within a constituent ILD layer in the ILD stack 103 using a damascene process in which conductive layers are deposited in openings formed in the constituent ILD layer and then polished or etched back to be planar with the constituent ILD layer as known to those skilled in the art. Of course, other interconnect fabrication techniques may be used to construct the different conductive interconnect layers, such as photoresist masking and plasma etching. At the fabrication stage illustrated in FIG. 1, the final or last metal layer (LM) has been polished until substantially coplanar with the top surface of the ILD stack 103, thereby exposing the topmost surface of each of the last metal layers 111, 121.

Figure 2:
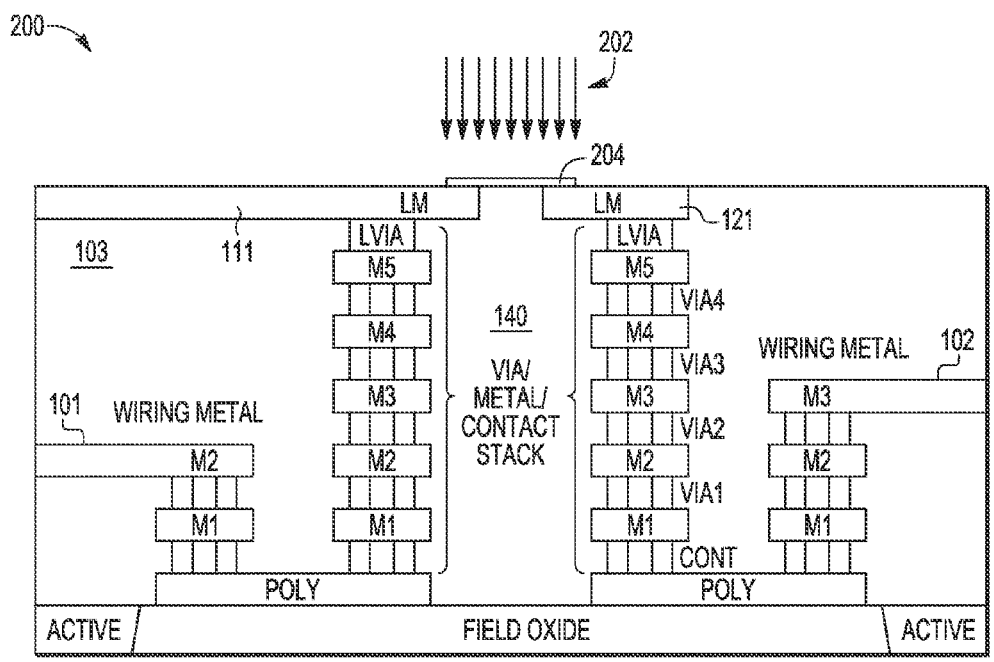
FIG. 2 illustrates processing subsequent to FIG. 1 after a thin ion beam deposited fuse layer is formed over the integrated circuit in accordance with selected embodiments of the disclosure.

FIG. 2 illustrates processing of the integrated circuit structure 200 subsequent to FIG. 1 after a thin ion beam deposited fuse layer 204 is formed over the integrated circuit. In selected embodiments, the fuse layer 204 is deposited by selectively applying a focused ion-beam 202 on the topmost surface of the integrated circuit structure 200 to form an electrically conductive bridge or fuse structure 204 connecting the last metal layers 111, 121. As will be appreciated by those skilled in the art, focused ion beam (FIB) deposition techniques can be used to provide site-specific deposition of very thin conductive layers (e.g., less than approximately 500 Angstroms) which are formed with an appropriate metal material (e.g., Ta, Ti, TaN, TiN, etc.). In view of the intended fuse programming function, the FIB-deposited metal layer 204 may be formed with a material that is suitably absorptive to a programming laser beam's spectrum. In addition, FIB tools may be used to deposit material by ion beam induced deposition, or to provide FIB-assisted chemical vapor deposition by introducing a precursor gas (e.g., tungsten hexacarbonyl) into the vacuum chamber and scanning a target deposition area with the beam to decompose the precursor gas into volatile and non-volatile components so that the non-volatile component (e.g., tungsten) remains on the surface as a deposition layer. FIB deposition techniques can be used to form a thin fuse layer 204 having very small dimension lengths (e.g., from nanometers to hundreds of micrometers in length) so that the thin fuse layer 204 can be precisely located. In other embodiments, Electron Beam Induced Deposition (EBID), micro-chemical vapor deposition (e.g., Mo, Ta, Ti, Cr, MoSi, etc.), laser-focused deposition, laser-focused atomic deposition, or atomic layer deposition (ALD), or any other micro-deposition or localized deposition techniques may also be used to form the fuse structure 204 without requiring application of an etch process to define the fuse structure 204.

In the context of the present disclosure, the use of the focused ion-beam 202 or any other suitable micro-deposition or localized deposition technique provides a single process step which accurately places the thin fuse layer 204 to electrically connect the last metal layers 111, 121. In this way, no etch processing is required to define the fuse layer 204 that could otherwise damage the underlying last metal or ILD layers. In addition, there is no requirement of etching additional protective films in order to protect the underlying last metal layers. And as seen from the relative placement of the thin fuse layer 204 in relation to the underlying last metal layers 111, 121, there is no overlap requirement for the fuse layer 204 needed to account for process variation, thereby effectively reducing the minimum pitch spacing between last metal features.

Figure 3:
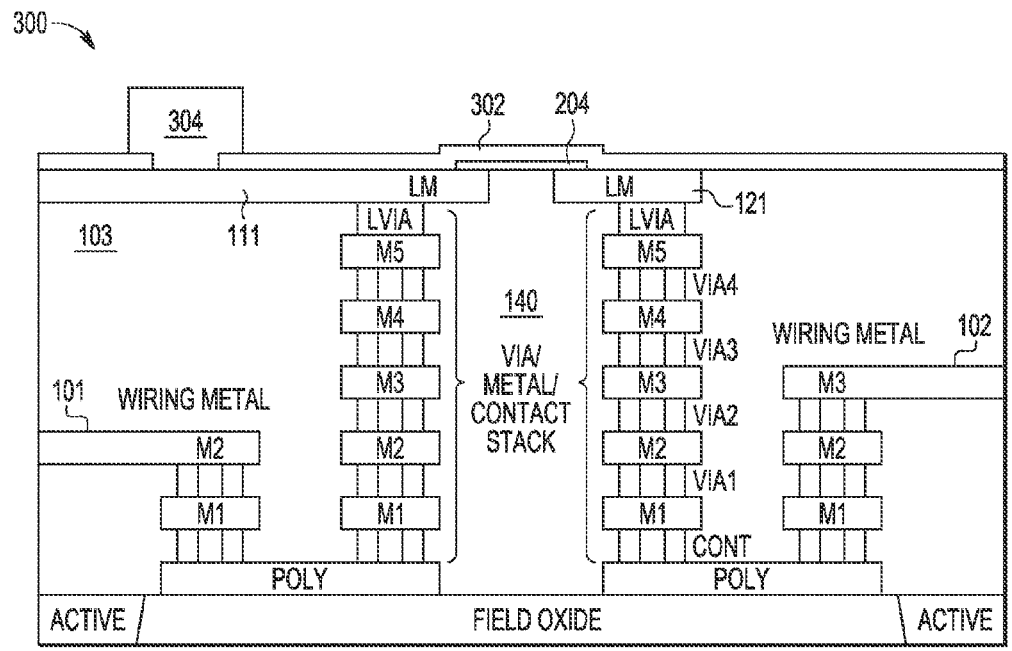
FIG. 3 illustrates processing subsequent to FIG. 2 after a passivation layer is formed over the ion beam deposited fuse layer and integrated circuit in accordance with selected embodiments of the disclosure.

FIG. 3 illustrates processing of the integrated circuit structure 300 subsequent to FIG. 2 after a passivation layer 302 is formed over the ion beam deposited fuse layer 204 and the remainder of the integrated circuit 300. The passivation layer 302 may be formed with one or more passivation layers that are deposited and/or grown to cover the ILD stack 103 and thin fuse layer 204 to protect the underlying layers from physical handling, the environment (especially humidity). In selected embodiments, the passivation layer(s) 302 may be formed by depositing an insulator or high-k dielectric (e.g., silicon dioxide, oxynitride, metal-oxide, silicon nitride, etc.) using CVD, PECVD, PVD, ALD, or any combination(s) of the above to a predetermined final thickness in the range of 100-500 Angstroms, though other thicknesses may be used. In an example embodiment, the passivation layer 302 is a stack of about 0.05 microns of silicon nitride under about 0.45 microns of silicon oxynitride as deposited, though any suitable material (such as another nitride material) and any other dimensions can be used. As a consequence of using focused ion beam deposition techniques to form the fuse layer, 204, the choice of materials used to form the fuse layer 204 and any passivation layer(s) 302 is not dictated by the need to prevent copper corrosion at the last metal layer since the fuse layer 204 is not etched. In other embodiments where the thin fuse layer 204 is formed with a self-passivating conductive material (e.g., Ta, Ti, TaN, TiN, Al, Au, Co, Cr, Cu, Fe, Mo, Nb, Ni, Pd, Pt, W, etc.), the FIB-deposited thin fuse layer 204 would be self-passivating or readily oxidized to form at least part of the passivation layer 302. In yet other embodiments, the final passivation film may be selectively removed over the fuse.

If desired, a contact pad 304 may also be formed in contact with a last metal layer (e.g., 111) using desired processing sequence. For example, after patterning and etching the passivation layer 302 to define an opening using photolithography techniques, the contact pad 304 may be formed by depositing, patterning, and etching one or more conductive layers, such as an optional barrier layer and/or metal layer (e.g., aluminum) that is formed using CVD, PECVD, PVD, ALD, electroplating, electroless plating, or any combination thereof. Contact pad 304 may serve the purpose of bonding, probing or electrical testing.

As shown in FIG. 3, the FIB-deposited thin fuse layer 204 allows the location to be defined so that the fuse layer 204 overlaps with the last metal layers 111, 121 by a predetermined minimum extent or amount, but need to extend past the last metal layers 111, 121. The resulting fuse layer 204 overlaps with the exposed interconnect last metal layers 111, 121 without forming an overhang portion that also extends past or beyond the exposed interconnect last metal layers 111, 121. As a result, the thin fuse layer 204 is formed to contact the last metal layers 111, 121 with some degree of overlap which may include completely covering the last metal layers 111, 121 in the vicinity of the fuse 204. In other embodiments, the FIB-deposited thin fuse layer 204 is formed to overlap with or extend over the LM terminals by some minimum amount without necessarily requiring complete coverage of the LM terminals. The resulting fuse connection structure 204 is formed in electrical contact with the last metal layers 111, 121, thereby electrically connecting the first circuit components or areas (connected to the second metal wiring metal 101) with the second circuit components or areas (connected to the third metal wiring metal 102).

In selected embodiments, the FIB-deposited fuse layer 204 is electrically connected to only the first and second circuits and is not electrically connected to any external circuitry. In this way, the FIB-deposited fuse layer 204 may be used as a permanent switch that is activated to allow activation or deactivation of circuitry (e.g. redundant memory columns or rows), to mark the integrated circuit device with a unique identification code, to allow one-time programming of circuitry, and the like. The permanent switch can be activated or toggled once by physically severing or blowing the FIB-deposited fuse layer 204. In other embodiments, the FIB-deposited fuse layer 204 can be used as a high sheet resistance resistor between the first and second circuits, provided that it is not blown or severed. In newer technologies with copper metallization and metal gates, this enables smaller resistors to reach the same resistance.

Figure 4:
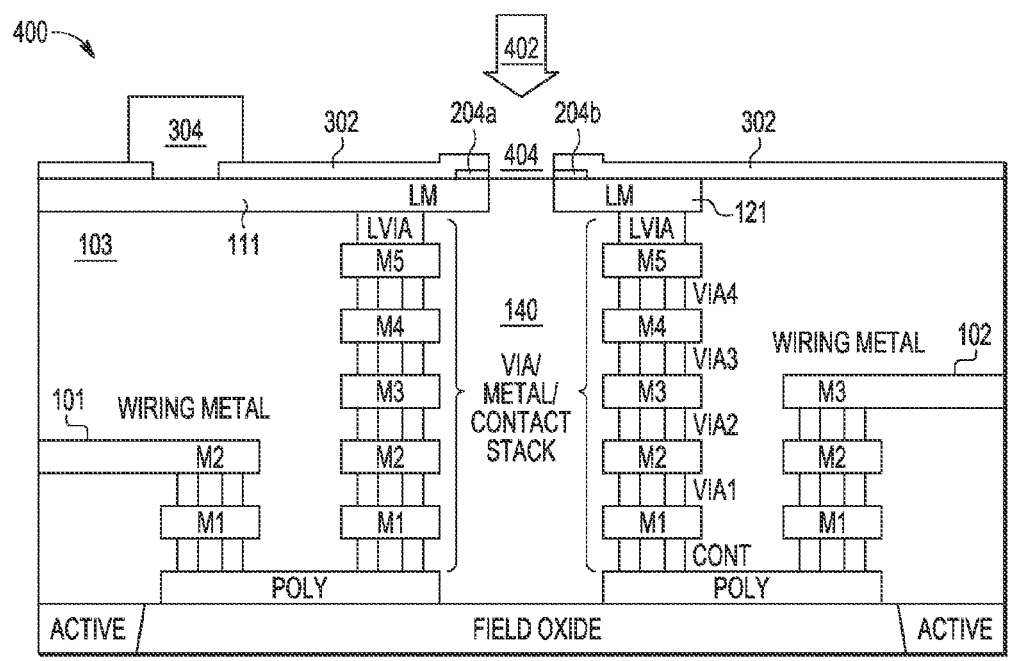
FIG. 4 illustrates processing subsequent to FIG. 3 after the ion beam deposited fuse layer blown with a laser programming step in accordance with selected embodiments of the disclosure.

Turning now to FIG. 4, there is illustrated processing of the integrated circuit structure 400 subsequent to FIG. 3 after the ion beam deposited fuse layer 204 is blown with a laser programming step. While any desired fuse programming technique may be used, in selected embodiments, a laser radiation or light 402 for the laser ablation of the FIB-deposited fuse layer 204 is shown to be aligned with the fuse layer 204 for purposes of programming or "blowing" the fuse layer 204. The laser wavelength is controlled to provide a defined energy or wavelength (e.g., 1,320 nm) so as to perform ablation on the FIB-deposited fuse layer 204, such as by using a laser pulse 402. For example, the programming laser pulse 402 is provided a YLF (yttrium lithium fluoride) laser that is pulsed with approximately 4 to 13 nanosecond pulse widths and directed at the FIB-deposited fuse layer 204, resulting in a physical opening formed in the fuse 204 and exposing the underlying multi-layer ILD stack 104. Any other suitable laser or energy source can be used which is effective in severing the FIB-deposited fuse layer 204 into electrically separate and physically distinct portions 204a, 204b. The power and spot size of the laser can be adjusted depending on the dimensions of the FIB-deposited fuse layer 204, such as thickness and width. For example, a 1047 nm laser providing a spot size of 4.5 µm and energy of up to 0.5 mJ to 1.20 µJ (or less) may be used to program a fuse 204 with a thickness of up to 500 Angstroms and a width of 1.2 µm Once the FIB-deposited fuse layer 204 is blown, an electrical opening (open circuit) is formed between the multi-layer interconnect stacks 110, 120, and therefore between the first and second circuits connected respectively to the multi-layer interconnect stacks 110, 120. Testing to determine if the first and second circuits have changed their respective electrical states may be performed. For example, a simple continuity test measuring the ability to pass current from one node to another may be performed.

As illustrated, the FIB-deposited fuse layer 204 may be formed on the last metal layer of the multi-layer interconnect stacks 110, 120. However, it will be appreciated that the fuse layers disclosed herein may also be formed in an earlier metal level (e.g., lower in the damascene interconnect stack). In these embodiments, persons skilled in the art will appreciate that any low-k or ultra-low-k ILD films may delaminate easier than the top most TEOS layer, in which case fabrication process adjustments should be made to account for such potential delamination. Also, with lower level or buried fuse layers, laser programming may be difficult to implement, in which case electrical programming techniques may instead be used.

The integrated circuit structures 300, 400 shown in FIG. 3 or 4 may be packaged after forming and/or blowing the FIB-deposited fuse layer 204 using any desired packaging technology. For example, the integrated circuit structures 300, 400 can be packaged, in a wirebonded package, such as a quad-flat package (QFP), and a ball grid array (BGA), a flip-chip package, a stacked package, a multi-chip module (MCM) package, combinations of the above, or any other package.

Figure 5:
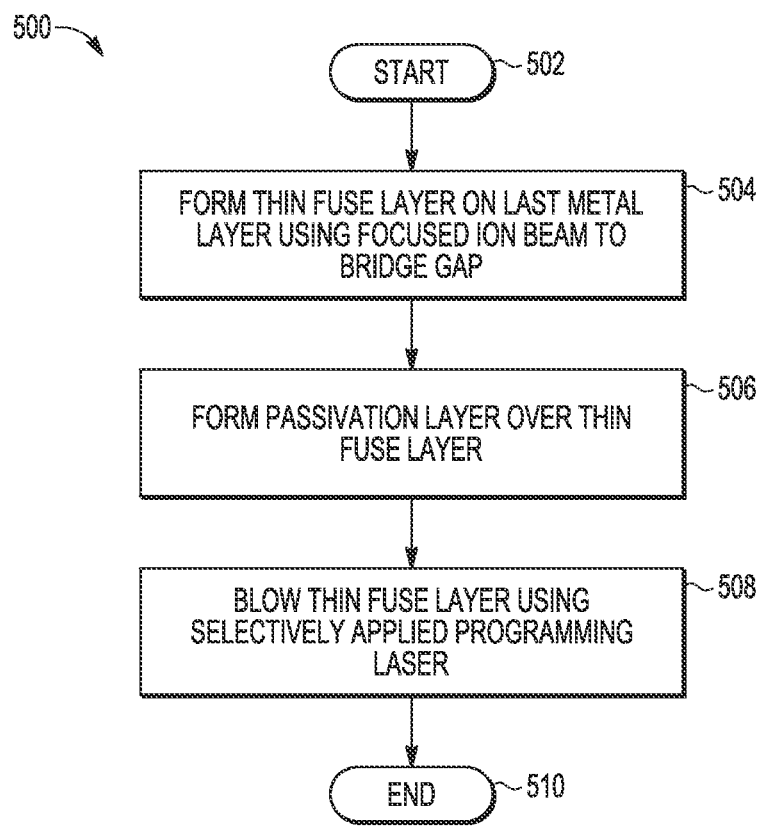
FIG. 5 shows an example fabrication process flow diagram for making a back-end-of-line thin ion beam deposited fuse.

Whether used to connect or programmably disconnect different circuit components or areas on a wafer or integrated circuit die, the FIB-deposited fuse structure and fabrication methodology described herein provides an efficient and low-cost way to selectively support disablement of selected circuitry. Turning now to FIG. 5, there is shown an example fabrication process flow diagram 500 for making a back-end-of-line thin ion beam deposited fuse. Though selected embodiments of the fuse fabrication and programming methodology are illustrated in FIG. 5, it will be appreciated by those of ordinary skill in the art that the sequence of illustrated steps may be modified, reduced or augmented in keeping with the disclosure of the present invention. For example, the passivation layer formation and/or laser programming steps may optionally be included or excluded. In addition, an additional step (not shown) for opening the passivation over the fuse using an etch process can be inserted between steps 506 and 508. Thus, it will be appreciated that the methodology of the present invention may be thought of as performing the identified sequence of steps in the order depicted in FIG. 5, though the steps may also be performed in parallel, in a different order, or as independent operations that are combined.

The description of the illustrative methodologies for making and using back-end-of-line thin ion beam deposited fuses can begin at step 502, where the integrated circuit structure is fabricated using a damascene integration process to form multi-layer interconnect stacks in an interlayer dielectric layer stack 103. In an example embodiment, the integrated circuit structure includes last metal layers in the interconnect stacks that are exposed on a coplanar surface after polishing the integrated circuit in a dual-damascene flow. While the integrated circuit structure may be formed with a planar top surface, the integrated circuit structure may have a non-planar surface, depending on the fabrication process and/or features formed.

At step 504, a micro-deposition process is used to form a thin fuse layer to a predetermined thickness (e.g., less than approximately 500 Angstroms) on the surface of the integrated circuit structure to make electrical contact with two exposed last metal layers that are connected, respectively, to separate circuit components or areas. Examples of micro-deposition processes include focused ion beam deposition, ion beam assisted deposition, electron beam induced deposition, and any other metal deposition process which enables fuse layer features to be defined without using an etch or trim process. However formed, the thin fuse layer bridges a gap between the exposed last metal layers, and does not require any etching of the deposited thin fuse layer. The material used to form the thin fuse layer may be a metal or other conductive material (e.g., Ta, Ti, TaN, TiN, etc.) that is easily passivated or oxidized and absorptive to the programming laser beam's energy or wavelength.

At step 506, a passivation layer is formed over the thin fuse layer and underlying integrated circuit structure using any desired passivation process. For example, the passivation layer may be formed by depositing an insulator or high-k dielectric (e.g., silicon dioxide, oxynitride, metal-oxide, silicon nitride, etc.) using CVD, PECVD, PVD, ALD, or any combination(s) thereof to a predetermined final thickness.

At step 508, the thin fuse layer may be blown or ablated using a selectively applied programming laser if desired to electrically disconnect the circuits connected to each side of the thin fuse layer. For example, by applying laser radiation or light in alignment with the thin fuse layer and controlling the laser wavelength or energy to ablate the thin fuse layer, the portion of the thin layer fuse receiving the programming laser energy may be physically severed or blown by absorbing energy from the laser. As will be appreciated, the thin fuse layer may also be electrically programmed to blow the fuse by applying excessive current to the thin fuse layer which causes electro-mechanical conductor failure and/or thermal melting of the thin fuse that results in an open (blown) fuse. Of course, if the circuits connected to each side of the thin fuse layer are not to be electrically disconnected, then the programming laser is not applied to the thin fuse layer. At step 510, the fabrication process flow ends, though it will be appreciated that additional back-end-of-line processing may occur to complete the fabrication of the integrated circuit structure, such as packaging, scribe cuts, die separation, testing, etc.

By now it should be appreciated that there has been provided an integrated circuit having a programmable fuse and associated method of fabrication. In the disclosed methodology, an integrated circuit structure is provided that has first and second exposed interconnect or metal layers electrically connected respectively to first and second circuits in the integrated circuit structure, where the first and second exposed metal layers are physically separated from one another by an interlayer dielectric layer. In selected embodiments, the integrated circuit structure is provided as a semiconductor substrate on which is formed a multi-layer interconnect stack formed with a dual damascene fabrication process to define a (top) planar interconnect stack surface having first and second exposed metal layers (e.g., copper) that are physically separated from one another by an interlayer dielectric layer in the multi-layer interconnect stack. In selected embodiments, the first and second exposed metal layers may be the topmost metal layers, or may be formed in metal layers below the ultimate top or last metal layer. Subsequent to providing the integrated circuit structure, a fuse layer is formed on the integrated circuit structure using a micro or localized deposition process to electrically connect the first and second exposed metal layers without applying an etch process to the fuse layer. In selected embodiments, the fuse layer is formed using focused ion beam deposition, ion beam induced deposition, focus ion beam-assisted chemical vapor deposition, selective laser deposition, laser atomic deposition, or electron beam induced deposition to form the fuse layer on the integrated circuit structure. In other embodiments, the fuse layer is formed to a thickness of less than approximately 500 Angstroms, such as by using focus ion beam deposition. In selected embodiments, the fuse layer is formed using focused ion beam deposition of Ta, Ti, TaN, TiN, Al, Au, Co, Cr, Cu, Fe, Mo, Nb, Ni, Pd, Pt, or W. In other embodiments, the fuse layer is formed with a focused ion beam deposited fuse layer to overlap with the first and second exposed metal layers without extending past the first and second exposed metal layers. Once the fuse layer is formed, an insulating layer may be formed over the fuse layer and integrated circuit structure. Subsequently, the fuse layer may be blown or programmed (e.g., with a laser) to electrically disconnect the first and second exposed metal layers from one another. In other embodiments, the fuse layer may be blown to electrically disconnect the first and second exposed metal layers from one another by selectively applying a programming laser or excessive current to the fuse layer to cause electro-mechanical conductor failure and/or thermal melting of the fuse layer form an open or blown fuse.

In another form, there is disclosed a method of forming an integrated circuit device. In the disclosed method, an integrated circuit device is provided with a multi-layer interconnect stack formed with a dual damascene fabrication process to define a (top) planar interconnect stack surface having first and second exposed damascene copper metal layers physically separated from one another by a topmost interlayer dielectric layer in the multi-layer interconnect stack. On the integrated circuit device, a localized deposition process is used to form a programmable thin conductive fuse layer on first and second exposed damascene metal layers of the integrated circuit device to electrically connect the first and second exposed metal layers without applying an etch process to the programmable thin conductive fuse layer, where the first and second exposed damascene metal layers are respectively coupled to first and second circuits in the integrated circuit device. The localized deposition process may include using at least one of focused ion beam deposition, ion beam induced deposition, focus ion beam-assisted chemical vapor deposition, selective laser deposition, laser atomic deposition, or electron beam induced deposition to form the programmable thin conductive fuse layer. For example, the programmable thin conductive fuse layer may be formed to a thickness of less than approximately 500 Angstroms using focused ion beam deposition of Ta, Ti, TaN, TiN, Al, Au, Co, Cr, Cu, Fe, Mo, Nb, Ni, Pd, Pt, or W. As formed, the focused ion beam deposited fuse layer may overlap with the first and second exposed damascene metal layers without extending past the first and second exposed damascene metal layers. In selected embodiments, an insulating layer may be formed over the programmable thin conductive fuse layer. In addition, the programmable thin conductive fuse layer may be blown to electrically disconnect the first and second exposed damascene metal layers from one another.

In yet another form, there is provided a semiconductor device and method for making and using same. In the disclosed semiconductor device, there is a substrate having first and second circuits formed therein. In addition, the semiconductor device includes a multi-layer interconnect stack formed on the substrate with a dual damascene fabrication process to define a planar interconnect stack surface having first and second exposed metal layers physically separated from one another by an interlayer dielectric layer in the multi-layer interconnect stack. The semiconductor device also includes a focused ion beam deposited fuse layer, which may be selectively programmed or open-circuited, formed overlying the interlayer dielectric layer and in physical or electrical contact with the first and second exposed metal layers. In selected embodiments, the focused ion beam deposited fuse layer is formed as a layer of Ta, Ti, TaN, TiN, Al, Au, Co, Cr, Cu, Fe, Mo, Nb, Ni, Pd, Pt, or W formed to a predetermined thickness of less than approximately 500 Angstroms. In selected embodiments, the focused ion beam deposited fuse layer is a metal-based layer formed to a predetermined thickness of approximately 100-500 Angstroms. Depending on the programming state of the FIB-deposited fuse layer, the first and second exposed metal layers may be electrically disconnected from one another by selectively applying a programming laser or excessive current to the fuse layer to cause electro-mechanical conductor failure and/or thermal melting of the fuse layer form an open or blown fuse.

Although the described exemplary embodiments disclosed herein are directed to various semiconductor and integrated circuit device structures and methods for making the same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming an integrated circuit having a programmable fuse, comprising:
    providing an integrated circuit structure comprising first and second exposed interconnects electrically connected respectively to first and second circuits in the integrated circuit structure, where the first and second exposed interconnects are physically separated from one another by an interlayer dielectric layer; and
    forming a fuse layer on the integrated circuit structure using a localized deposition process to electrically connect the first and second exposed interconnects without applying an etch process to the fuse layer.

2. The method of claim 1, where providing the integrated circuit structure comprises providing a semiconductor substrate on which is formed a multi-layer interconnect stack formed with a dual damascene fabrication process to define a top planar interconnect stack surface having first and second exposed interconnects comprising copper that are physically separated from one another by a topmost interlayer dielectric layer in the multi- layer interconnect stack.

3. The method of claim 1, further comprising forming an insulating layer over the fuse layer and integrated circuit structure.

4. The method of claim 1, further comprising blowing the fuse layer to electrically disconnect the first and second exposed interconnects from one another.

5. The method of claim 1, where forming the fuse layer comprises using at least one of the group consisting of focused ion beam deposition, ion beam induced deposition, focus ion beam-assisted chemical vapor deposition, selective laser deposition, laser atomic deposition, or electron beam induced deposition to form the fuse layer on the integrated circuit structure.

6. The method of claim 1, where forming the fuse layer comprises using focused ion beam deposition to form the fuse layer on the integrated circuit structure.

7. The method of claim 1, where forming the fuse layer comprises forming a thin fuse layer to a thickness of less than approximately 500 Angstroms.

8. The method of claim 1, where forming the fuse layer comprises forming the fuse layer using focused ion beam deposition of at least one of the group consisting of Ta, Ti, TaN, TiN, Al, Au, Co, Cr, Cu, Fe, Mo, Nb, Ni, Pd, Pt, or W.

9. The method of claim 1, where forming the fuse layer comprises forming a focused ion beam deposited fuse layer to overlap with the first and second exposed interconnects without forming an overhang portion that also extends past the first and second exposed interconnects.

10. The method of claim 1, where providing the integrated circuit structure comprises providing a semiconductor substrate on which is formed a multi-layer interconnect stack formed with a dual damascene fabrication process to define a planar interconnect stack surface having first and second exposed interconnects physically separated from one another by an interlayer dielectric layer in the multi-layer interconnect stack.

11. The method of claim 1, further comprising blowing the fuse layer to electrically disconnect the first and second exposed interconnects from one another by selectively applying a programming laser or excessive current to the fuse layer to cause electro- mechanical conductor failure and/or thermal melting of the fuse layer form an open or blown fuse.

12. A method of forming an integrated circuit device, comprising using a localized deposition process to form a programmable thin conductive fuse layer on first and second exposed interconnects of the integrated circuit device to electrically connect the first and second exposed interconnects without applying an etch process to the programmable thin conductive fuse layer, where the first and second exposed interconnects are respectively coupled to first and second circuits in the integrated circuit device.

13. The method of claim 12, further comprising providing the integrated circuit device with a multi-layer interconnect stack formed with a dual damascene fabrication process to define a top planar interconnect stack surface having first and second exposed damascene interconnects comprising copper that are physically separated from one another by a topmost interlayer dielectric layer in the multi-layer interconnect stack.

14. The method of claim 12, further comprising forming an insulating layer over the programmable thin conductive fuse layer.

15. The method of claim 12, further comprising blowing the programmable thin conductive fuse layer to electrically disconnect the first and second exposed damascene interconnects from one another.

16. The method of claim 12, where using the localized deposition process comprises using at least one of the group consisting of focused ion beam deposition, ion beam induced deposition, focus ion beam-assisted chemical vapor deposition, selective laser deposition, laser atomic deposition, or electron beam induced deposition to form the programmable thin conductive fuse layer.

17. The method of claim 12, where forming the programmable thin conductive fuse layer comprises forming a fuse layer to a thickness of less than approximately 500 Angstroms.

18. The method of claim 12, where forming the programmable thin conductive fuse layer comprises using focused ion beam deposition of at least one of the group consisting of Ta, Ti, TaN, TiN, Al, Au, Co, Cr, Cu, Fe, Mo, Nb, Ni, Pd, Pt, or W.

19. The method of claim 12, where forming the programmable thin conductive fuse layer comprises forming a focused ion beam deposited fuse layer to overlap with the first and second exposed damascene interconnects without forming an overhang portion that also extends beyond the first and second exposed damascene interconnects.

* * * * *